United States Patent [19]
Helm et al.

[11] Patent Number: 5,970,335
[45] Date of Patent: Oct. 19, 1999

[54] SEMICONDUCTOR PROCESSING METHOD OF FORMING COMPLEMENTARY N-TYPE DOPED AND P-TYPE DOPED ACTIVE REGIONS WITHIN A SEMICONDUCTOR SUBSTRATE

[75] Inventors: Mark Helm; Charles Dennison, both of Boise, Id.

[73] Assignee: Micron Technology, Inc., Boise, Id.

[21] Appl. No.: 08/797,547

[22] Filed: Feb. 7, 1997

Related U.S. Application Data

[63] Continuation of application No. 08/503,199, Jul. 17, 1995, Pat. No. 5,624,863.

[51] Int. Cl.$^6$ .............................................. H01L 21/8238
[52] U.S. Cl. ................. 438/232; 438/233; 148/DIG. 123
[58] Field of Search ................................... 438/232, 233; 148/DIG. 123

[56] References Cited

U.S. PATENT DOCUMENTS

| | | | |
|---|---|---|---|
| 4,707,457 | 11/1987 | Erb | 438/297 |
| 5,145,799 | 9/1992 | Rodder | 437/47 |
| 5,179,033 | 1/1993 | Adan | 437/52 |
| 5,204,279 | 4/1993 | Chan et al. | 437/52 |
| 5,422,289 | 6/1995 | Pierce | 438/297 |
| 5,571,733 | 11/1996 | Wu et al. | 438/227 |

*Primary Examiner*—John F. Niebling
*Assistant Examiner*—John Murphy
*Attorney, Agent, or Firm*—Wells, St. John, Roberts, Gregory & Matkin, P.S.

[57] ABSTRACT

A semiconductor processing method of forming complementary first conductivity type doped and second conductivity type doped active regions within a semiconductor substrate includes, a) providing a semiconductor substrate; b) masking a desired first conductivity type region of the substrate while conducting second conductivity type doping into a desired second conductivity type active region of the substrate; c) providing an insulating layer over the substrate over the desired first conductivity type region and the second conductivity type doped region; d) patterning the insulating layer to provide a void therethrough to the desired first conductivity type region; e) filling the void with a first conductivity type doped polysilicon plug, the plug having a first conductivity type dopant impurity concentration of at least $1 \times 10^{20}$ ions/cm$^3$, the desired first conductivity type region having a first conductivity type dopant concentration prior to the filling step which is in the range of from 0 ions/cm$^3$ to $1 \times 10^{19}$ ions/cm$^3$; and f) annealing the substrate for a period of time effective to out-diffuse first conductivity type dopant impurity from the first conductivity type doped polysilicon plug into the substrate to form the desired first conductivity type active region having a first conductivity type dopant impurity concentration of at least $1 \times 10^{20}$ ions/cm$^3$ in the substrate. Methods of forming CMOS FET transistors, and SRAM and DRAM CMOS circuitry are also disclosed.

19 Claims, 9 Drawing Sheets

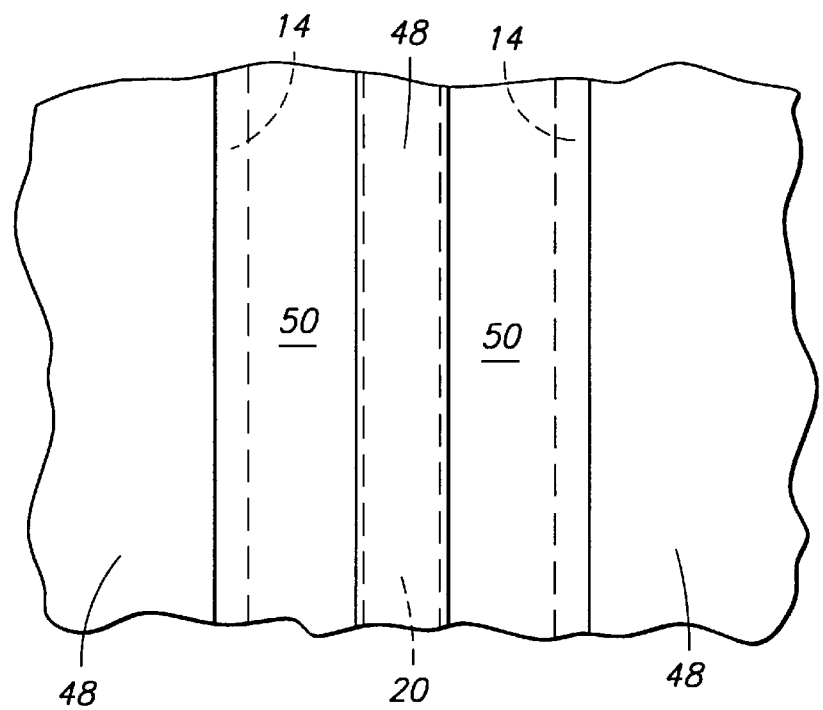
_Fig. 4_
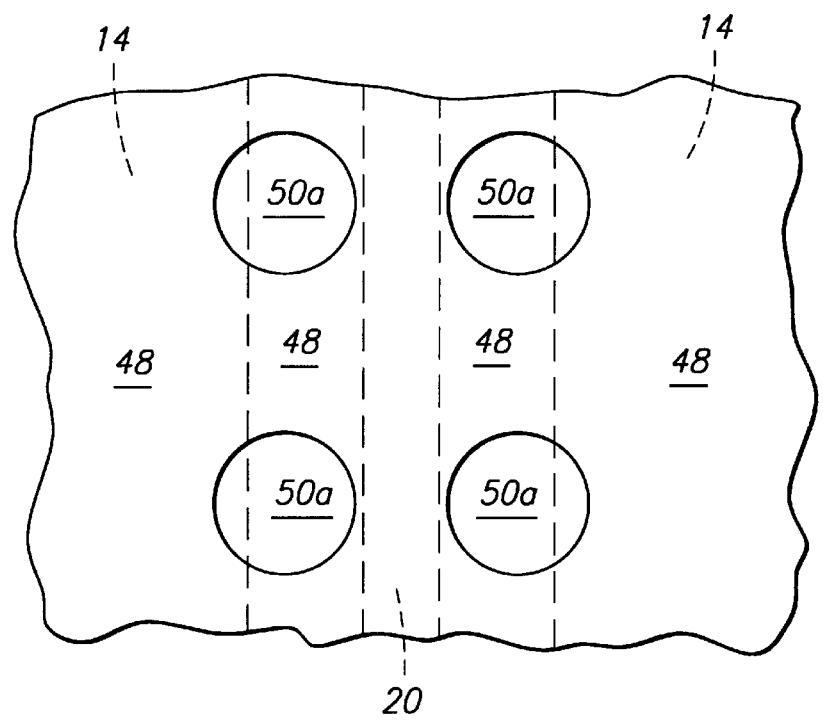
_Fig. 5_

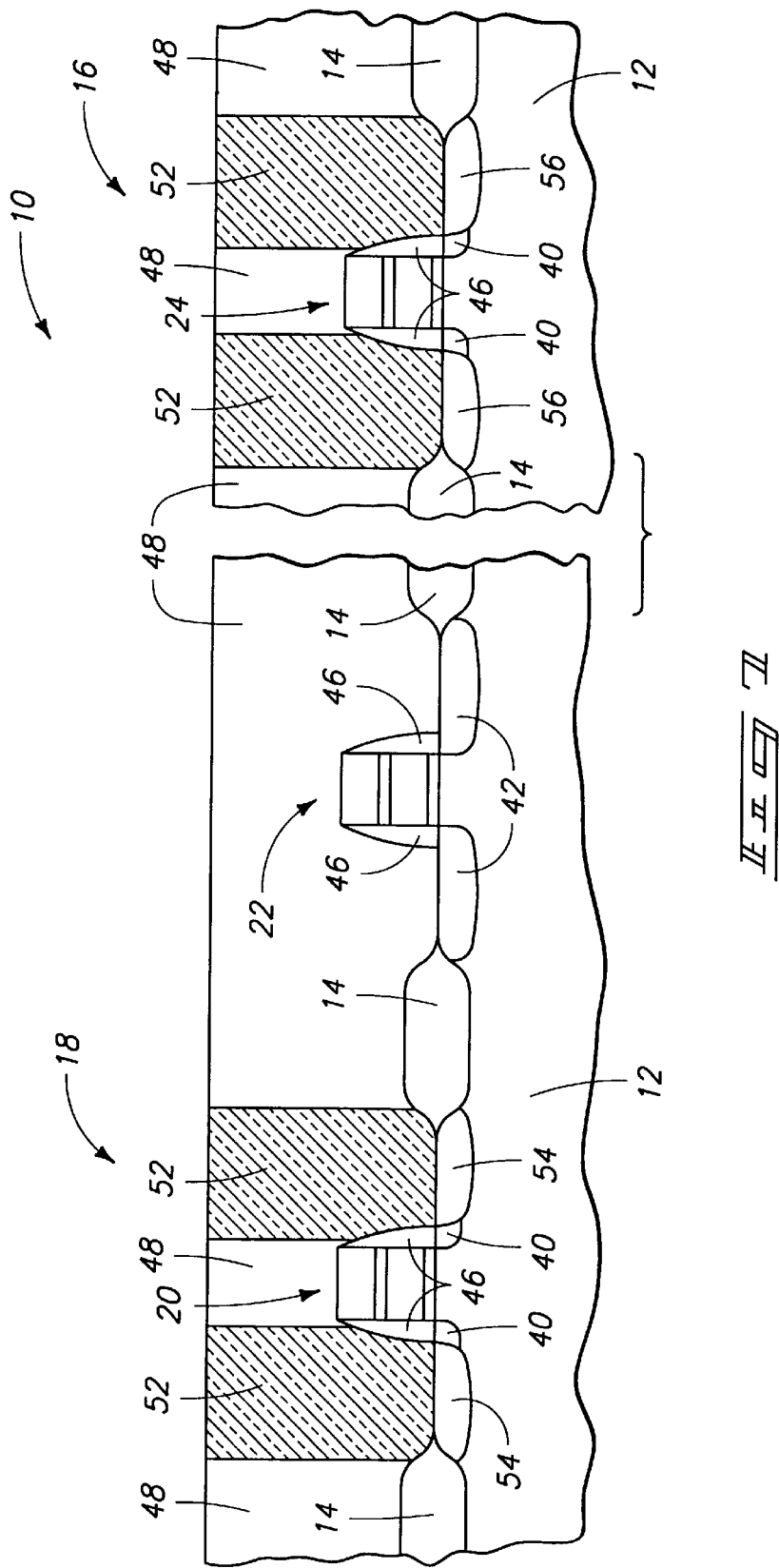

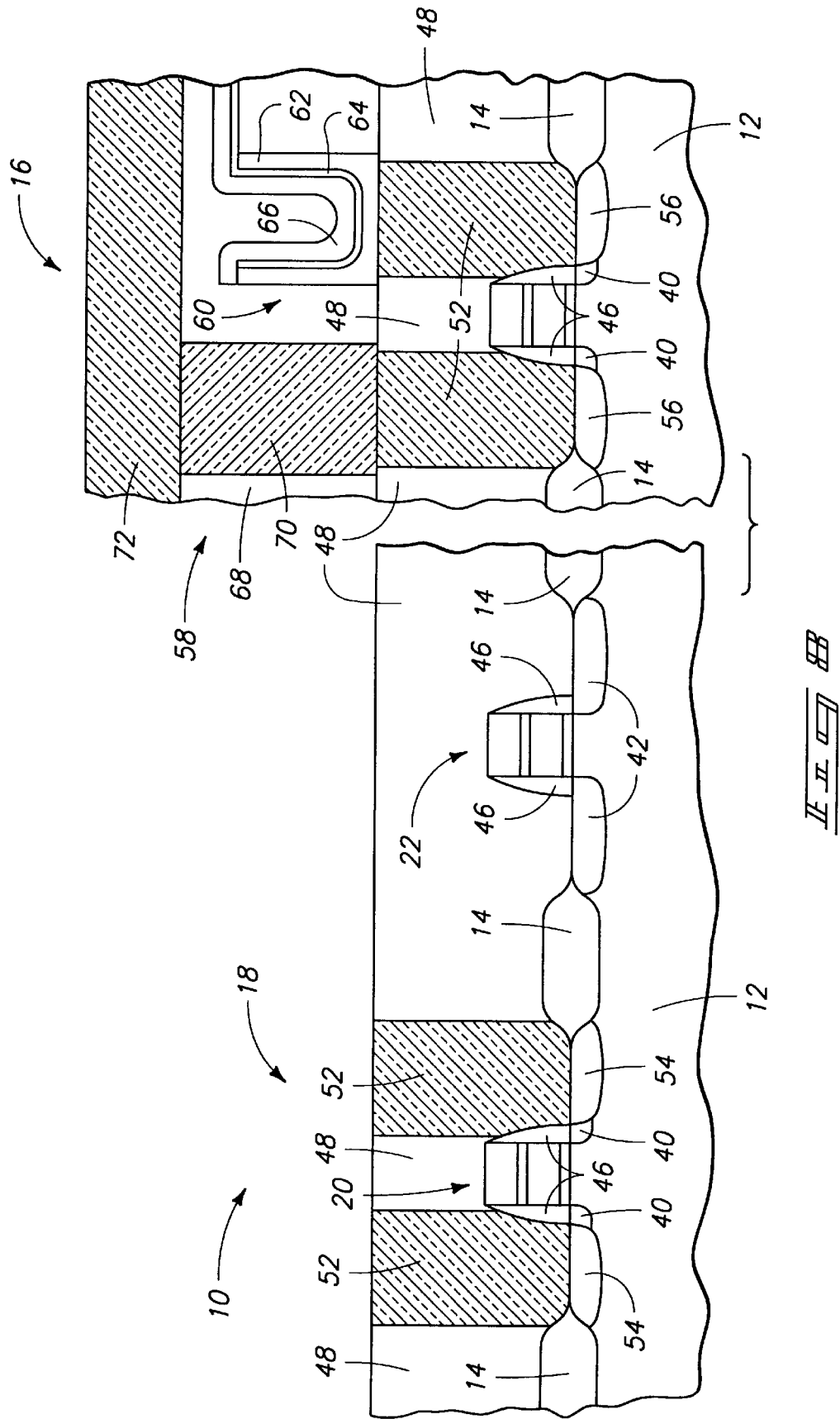

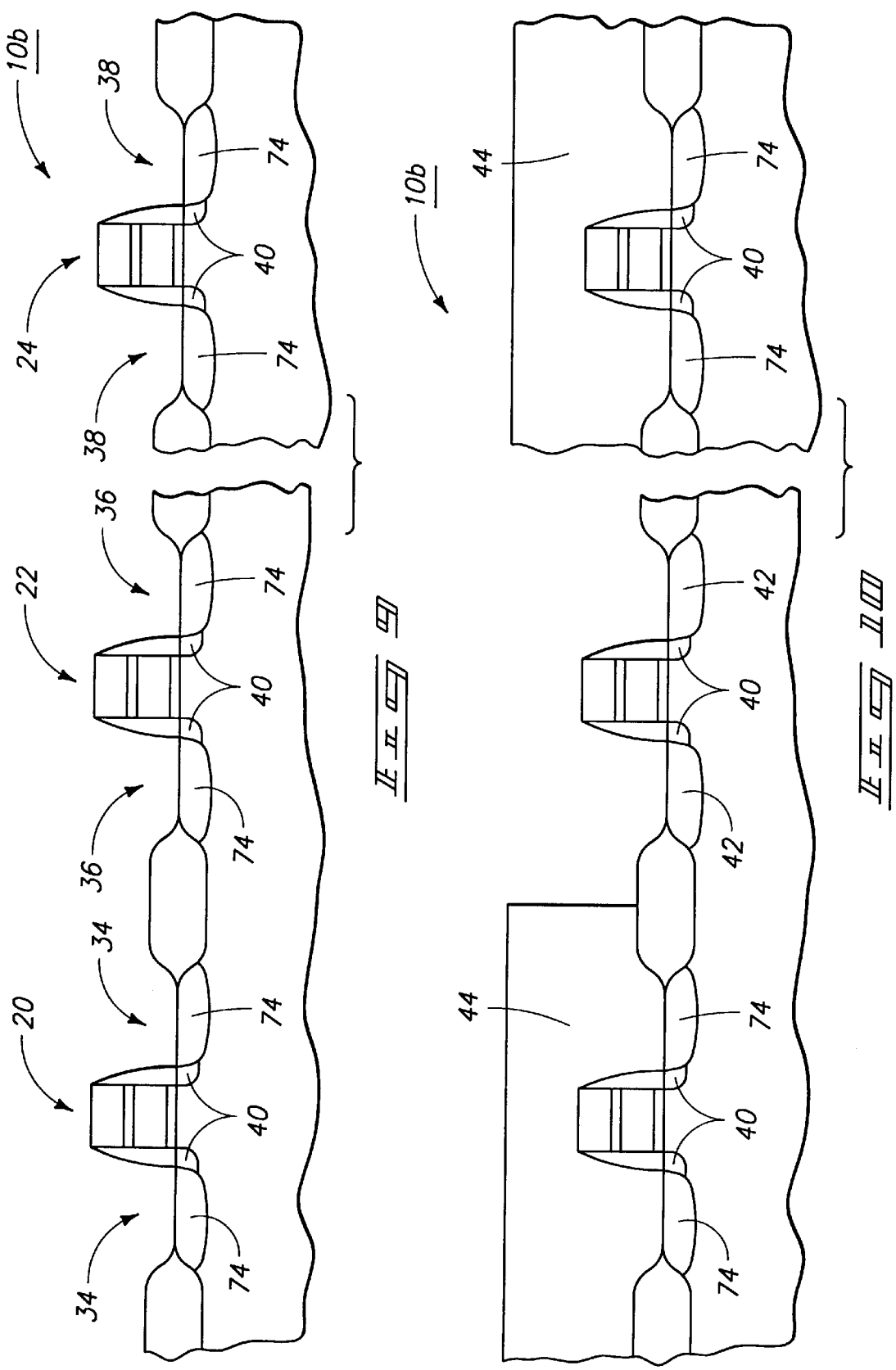

SEMICONDUCTOR PROCESSING METHOD OF FORMING COMPLEMENTARY N-TYPE DOPED AND P-TYPE DOPED ACTIVE REGIONS WITHIN A SEMICONDUCTOR SUBSTRATE

RELATED PATENT DATA

This patent resulted from a continuation application of U.S. patent application Ser. No. 08/503,199, filed on Jul. 17, 1995, now U.S. Pat. No. 5,624,863, entitled "A Semiconductor Processing Method Of Forming Complementary N-Type And P-Type Doped Active Regions Within A Semiconductor Substrate" listing the inventors as Mark Helm and Charles Dennison.

TECHNICAL FIELD

This invention relates to semiconductor processing methods of forming complementary n-type doped and p-type doped active regions within a semiconductor substrate. More particularly, this invention relates to complementary metal oxide semiconductor (CMOS), dynamic random access memory processing methods, and CMOS static random access memory processing methods.

BACKGROUND OF THE INVENTION

An MOS (metal-oxide-semiconductor) structure in semiconductor processing is created by superimposing several layers of conducting, insulating and transistor-forming materials. After a series of processing steps, a typical structure might comprise levels of diffusion, polysilicon and metal that are separated by insulating layers.

CMOS is so-named because it uses two types of transistors, namely an n-type transistor (NMOS) and a p-type transistor (PMOS). These are fabricated in a semiconductor substrate, typically silicon, by using either negatively doped silicon that is rich in electrons or positively doped silicon that is rich in holes. Different dopant ions are utilized for doping the desired substrate regions with the desired concentration of produced holes or electrons.

NMOS remained the dominant MOS technology as long as the integration level devices on a chip was sufficiently low. It is comparatively inexpensive to fabricate, very functional dense, and faster than PMOS. With the dawning of large scale integration, however, power consumption in NMOS circuits began to exceed tolerable limits. CMOS represented a lower-power technology capable of exploiting large scale integration fabrication techniques.

CMOS fabrication does however provide a number of challenges to the fabricator in compared to using PMOS or NMOS alone. Specifically, typically independent or separate masking steps are utilized for masking one of the p-type regions while the n-type region is being ion implanted. Also, the n-type regions are separately masked when the p-type regions are being ion implanted or diffusion doped. Accordingly, typical transistor flows use one mask each to form the n-channel and p-channel transistor source and drain regions.

It would be desirable to develop methods which facilitate formation of complementary source and drain regions within a semiconductor substrate, and preferably minimize masking steps in the process.

BRIEF DESCRIPTION OF THE DRAWINGS

Preferred embodiments of the invention are described below with reference to the following accompanying drawings.

FIG. 4 is a top view of a portion of FIG. 3.

FIG. 5 is an alternate embodiment top view of a portion of FIG. 3.

FIG. 7 is a view of the FIG. 1 wafer at a processing step subsequent to that shown by FIG. 6.

FIG. 8 is a view of the FIG. 1 wafer at a processing step subsequent to that shown by FIG. 7.

FIG. 9 is a diagrammatic sectional view of an alternate embodiment semiconductor wafer fragment at one processing step in accordance with the invention.

FIG. 10 is a view of the FIG. 9 wafer at a processing step subsequent to that shown by FIG. 9.

DETAILED DESCRIPTION OF THE PREFERRED EMBODIMENTS

Figures 1, 2:
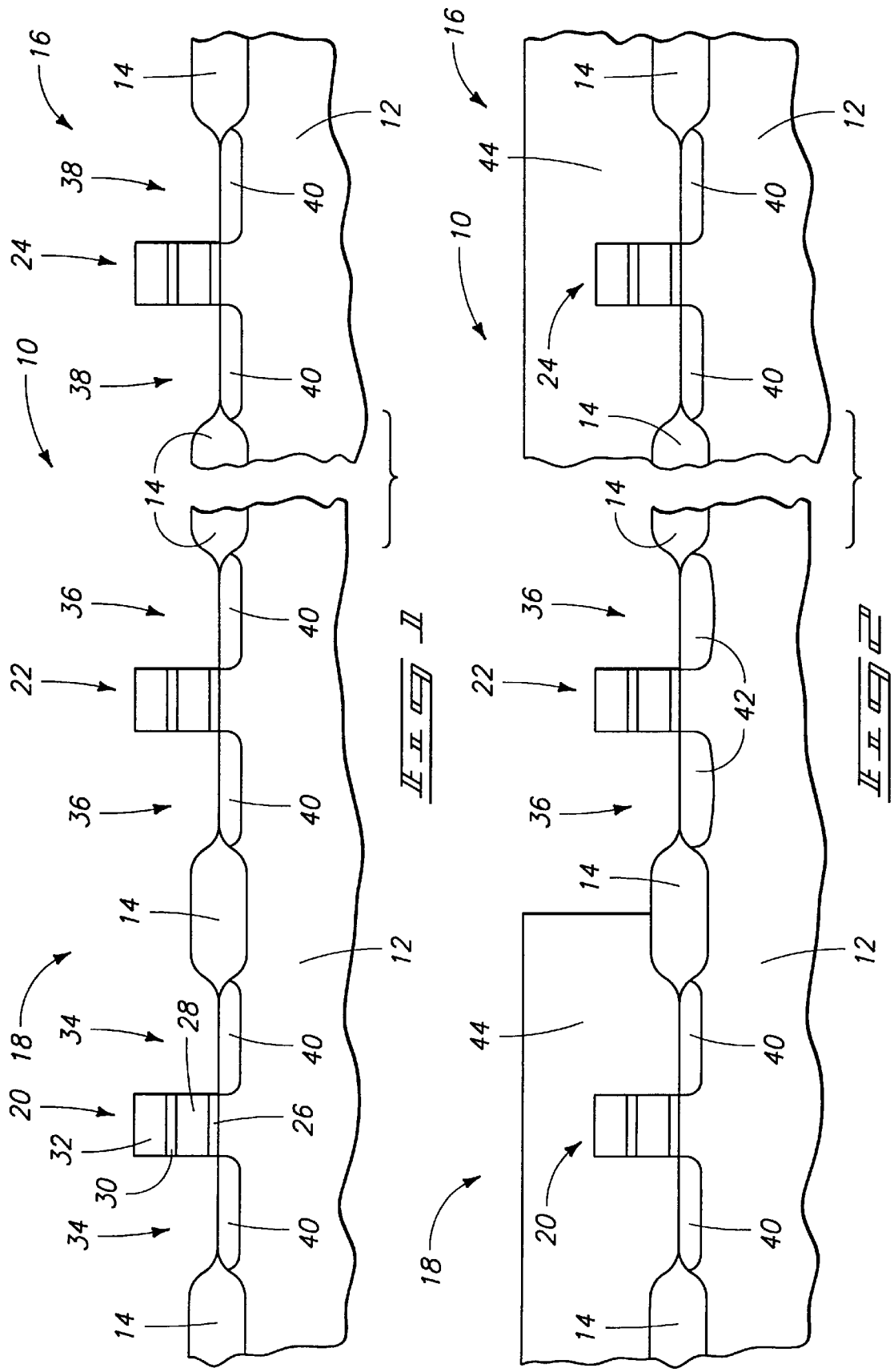
FIG. 1 is a diagrammatic sectional view of the semiconductor wafer fragment at one processing step in accordance with the invention.
FIG. 2 is a view of the FIG. 1 wafer at a processing step subsequent to that shown by FIG. 1.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming CMOS dynamic random access memory within a semiconductor substrate, the memory comprising an array area and an area peripheral to the array, the peripheral area comprising complementary n-type field effect transistors and p-type field effect transistors, comprises the following steps:

providing a semiconductor substrate having a defined memory array area and a defined peripheral area;

providing first and second field effect transistor gates in the peripheral substrate area, the first gate to be utilized for formation of an n-type field effect transistor, the second gate to be utilized for formation of a p-type field effect transistor, the first gate defining opposing peripheral substrate regions for formation of desired opposing n-type substrate active regions, the second gate defining opposing peripheral substrate regions for formation of desired opposing p-type substrate active regions;

masking the first gate and the desired n-type regions of the peripheral substrate area while conducting p-type conductivity doping into the desired p-type regions of the peripheral substrate area;

providing an insulating layer over the peripheral substrate area over the desired n-type regions and the p-type doped regions;

patterning the insulating layer to provide a void therethrough to each desired n-type region;

filling the respective voids with an n-type conductively doped polysilicon plug, the plugs having an n-type dopant impurity concentration of at least $1\times10^{20}$ ions/ cm$^3$, the desired n-type regions having an n-type dopant concentration prior to the filling step which is in the range of from 0 ions/cm$^3$ to 1×10$^{19}$ ions/cm$^3$;

annealing the substrate for a period of time effective to out-diffuse n-type dopant impurity from the n-type conductively doped polysilicon plugs into the substrate to form the desired n-type active regions having an n-type dopant impurity concentration of at least 1×10$^{20}$ ions/cm$^3$ in the substrate; and providing a series of dynamic random access memory cells within the array, the memory cells comprising a series of n-type field effect transistors and associated capacitors.

In accordance with another aspect of the invention, a semiconductor processing method of forming CMOS static random access memory within a semiconductor substrate comprises the following steps:

providing a semiconductor substrate;

providing first, second, third and fourth field effect transistor gates on the substrate, the first and second gates to be utilized for formation of cross-coupled SRAM n-type field effect driver transistors, the third and fourth gates to be utilized for formation of SRAM p-type field effect load transistors, the first and second gates defining respective opposing substrate regions for formation of desired opposing n-type substrate active regions, the third and fourth gates defining respective opposing substrate regions for formation of desired opposing p-type substrate active regions;

masking the first gate, the second gate and the desired n-type regions while conducting p-type conductivity doping into the desired p-type regions of the substrate;

providing an insulating layer over the substrate over the desired n-type regions and the p-type doped regions;

patterning the insulating layer to provide a void therethrough to each desired n-type region;

filling the respective voids with an n-type conductively doped polysilicon plug, the plugs having an n-type dopant impurity concentration of at least 1×10$^{20}$ ions/cm$^3$, the desired n-type regions having an n-type dopant concentration prior to the filling step which is in the range of from 0 ions/cm$^3$ to 1×10$^{19}$ ions/cm$^3$;

annealing the substrate for a period of time effective to out-diffuse n-type dopant impurity from the n-type conductively doped polysilicon plugs into the substrate to form the desired n-type active regions having an n-type dopant impurity concentration of at least 1×10$^{20}$ ions/cm$^3$ in the substrate;

electrically interconnecting one of the conductive plugs of the first driver transistor to one of the conductive plugs of the second driver transistor;

electrically interconnecting the other conductive plug of the first driver transistor with the second gate and with one of the p-type regions of one of the load transistors; and electrically interconnecting the other conductive plug of the second driver transistor with the first gate and with one of the p-type regions of the other load transistor.

These and other aspects of the invention will be appreciated from the following description and concluding claims.

Referring first to FIG. 1, a semiconductor wafer fragment at one semiconductor processing step in forming CMOS dynamic random access memory is indicated generally with reference numeral 10. Fragment 10 is comprised of a bulk silicon substrate 12 having isolation field oxide regions 14 formed therewithin. Fragment 10 comprises a memory array area 16 within which the principal and numerous memory cells will be provided, and a peripheral area 18.

First and second field effect transistor gates 20 and 22, respectively, are provided in peripheral substrate area 18, while an array gate 24 is provided in array area 16. Voluminous other transistors would, of course, typically be provided on the wafer, with only the pertinent few to the preferred embodiment being shown for clarity. Each transistor gate is comprised of a typical gate oxide 26, overlying conductive polysilicon region 28, a higher conductivity silicide capping layer 30, and a concluding electrically insulative cap 32 (numbered in a portion of FIG. 1 only, for clarity). In the illustrated and described embodiment, first gate 20 will be utilized for formation of an n-type field effect transistor, while second gate 22 will be utilized for formation of a p-type field effect transistor. Thus, first gate 20 defines opposing peripheral substrate regions 34 for formation of desired opposing n-type substrate active regions. Likewise, second gate 22 defines opposing peripheral substrate regions 36 for formation of desired opposing p-type substrate active regions. In the preferred embodiment, array transistor 24 is NMOS, with gate 24 thus defining opposing array substrate regions 38 for formation of desired source/drain diffusion regions within the array.

A blanket n-type dopant implant to a substrate concentration of less than 1×10$^{19}$ ions/cm$^3$ is provided into the desired n-type regions 34, 38 and the desired p-type regions 36, thus producing the illustrated implant regions 40. Such will be utilized to form lightly-doped-drain (LDD) regions of the NMOS transistors. Thus, a typical and preferred dopant concentration for regions 40 is 1×10$^{18}$ ions/cm$^3$.

Referring to FIG. 2, first gate 20, array gate 24, and desired n-type regions 34 and 38 are masked with photoresist 44 while conducting overwhelming p-type conductivity doping into the desired p-type regions 36 of the peripheral substrate area, thus forming p-type implant regions 42. The typical and preferred dose for the implant is 5×10$^{15}$ ions/cm$^2$–1×10$^{16}$ ions/cm$^2$, to produce an average 42 region dopant density of 5×10$^{19}$ ions/cm$^3$–1×10$^{21}$ ions/cm$^3$. This the p-type doping for the PMOS transistors overwhelms or overcompensates the previous LDD doping.

Figure 3:
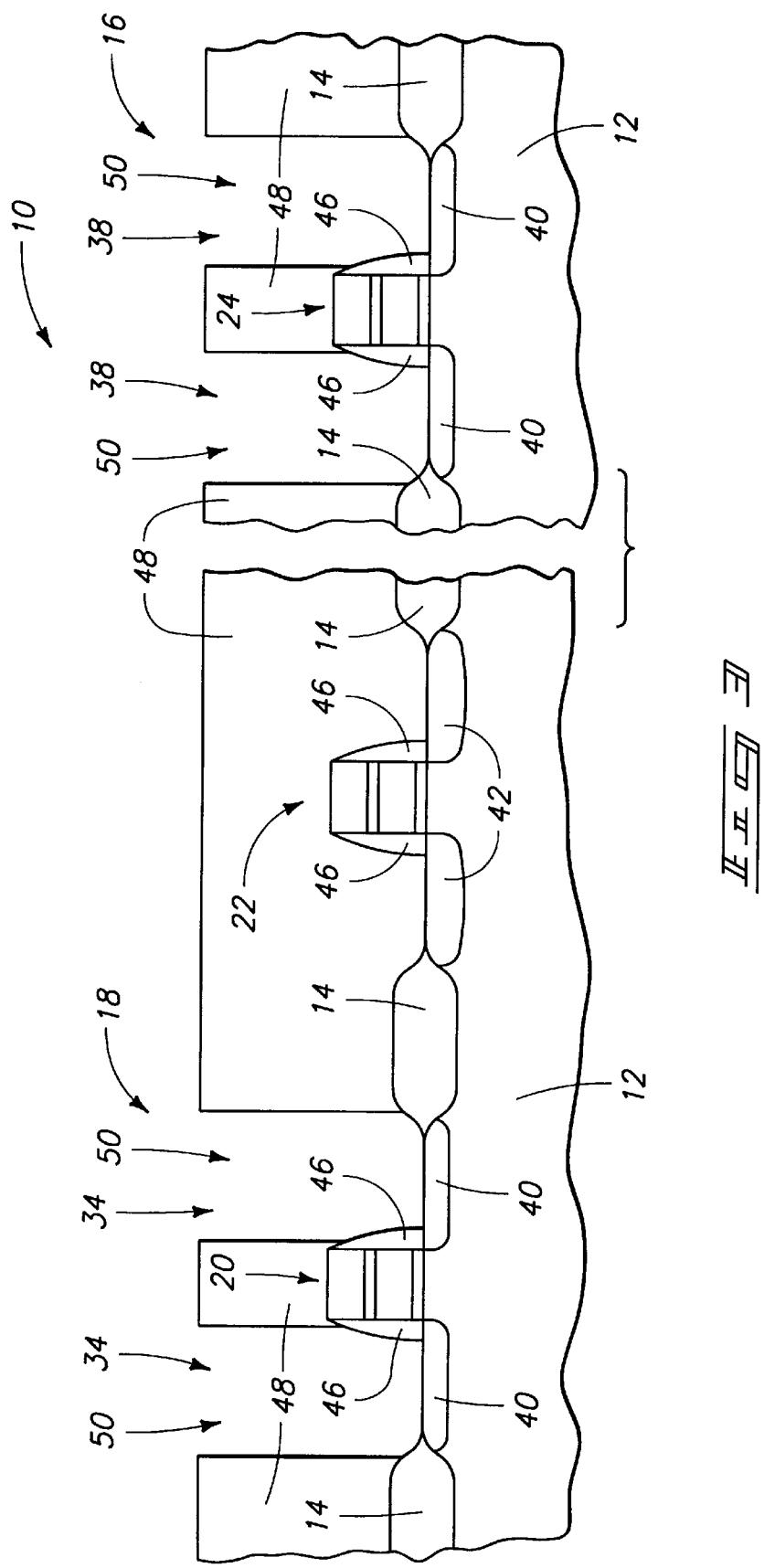
FIG. 3 is a view of the FIG. 1 wafer at a processing step subsequent to that shown by FIG. 2.

Referring to FIG. 3, oxide spacers 46 are provided about the illustrated transistor gates utilizing conventional oxide deposition and subsequent anisotropic spacer etching. Subsequently, an insulating layer 48, preferably borophosphosilicate glass (BPSG), is provided over the substrate, and accordingly over peripheral substrate area 18 over desired n-type regions 34 and p-type doped regions 42. Electrically insulating layer 48 is thereafter patterned to provide a void 50 therethrough to each desired n-type region 34 and 38. Referring to FIG. 4, voids 50 are in the shape of elongated troughs for formation of continuous NMOS active areas. Alternately with reference to FIG. 5, voids 50a could comprise substantially circular cross-sectioned contact openings for formation of discontinuous NMOS active areas.

Figure 6:
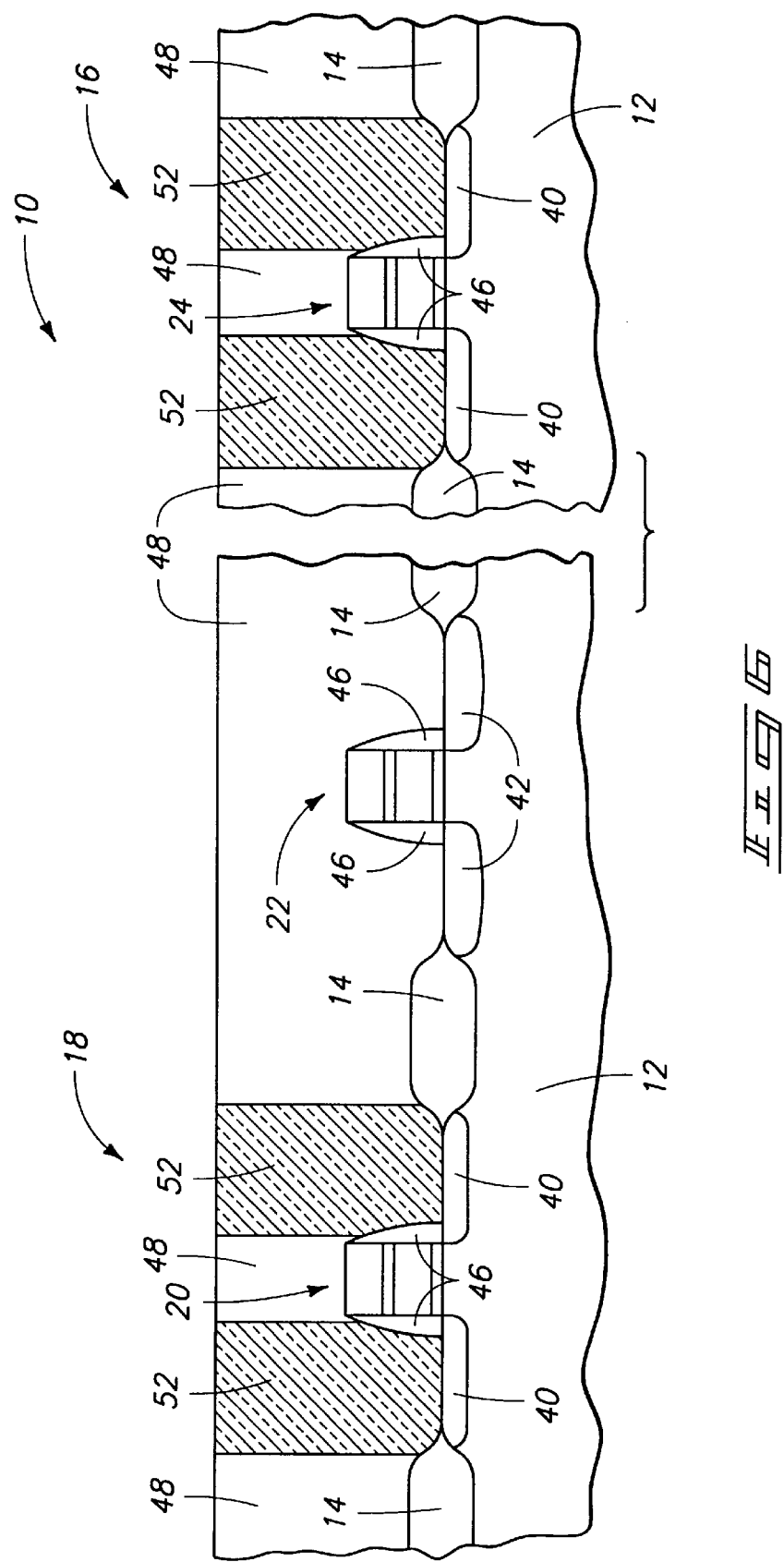
FIG. 6 is a view of the FIG. 1 wafer at a processing step subsequent to that shown by FIG. 3.

Referring to FIG. 6, voids 50 are filled with an n-type conductively doped polysilicon material, thus providing conductive plugs 52. The desired n-type regions 34 and 38 will have an n-type dopant concentration prior to the filling step which is in the range of from 0 ion/cm$^3$ to 1×10$^{19}$ ions/cm$^3$. Such plugs will have an n-type dopant impurity concentration of at least 1×10$^{20}$ ions/cm$^3$, with an impurity concentration of from 1×10$^{20}$ ions/cm$^3$–5×10$^{20}$ ions/cm$^3$, being preferred. Greater ion concentration would probably not be desirable in order to avoid short-channel effects within the resultant transistors. A preferred method for provision of polysilicon plugs 52 would be by an in-situ doped polysilicon layer, followed by chemical-mechanical planarizing such poly and insulating layer 48 back to produce the FIG. 6 illustrated construction.

Referring to FIG. 7, substrate 10 is annealed for a period of time effective to out-diffuse n-type dopant impurity from n-type conductively doped polysilicon plugs 52 into substrate 12 to form desired n-type active regions 54 and 56 having an n-type dopant impurity concentration of at least $1 \times 10^{20}$ ions/cm$^3$ in the substrate. An example anneal would be to subject the wafer to a temperature of 800° C. in an inert environment for 10 minutes. Most preferably, a dedicated anneal step is not conducted when subsequent wafer processing steps would inherently subject the wafer to temperature conditions for a time period suitable to cause the diffusion into the substrate.

Referring to FIG. 8, subsequent processing is conducted to produce a series of dynamic random access memory cells within the array, with one such cell being indicated by reference numeral 58. Such comprises a capacitor 60 having a storage node cell plate 62, capacitor dielectric layer 64, and cell capacitor plate 66. An encapsulating insulating layer 68 is provided, with a conductive plug 70 provided therethrough to the illustrated plug 52. Subsequently, a conductive layer is deposited and patterned to form a bit line 72.

Figure 11:
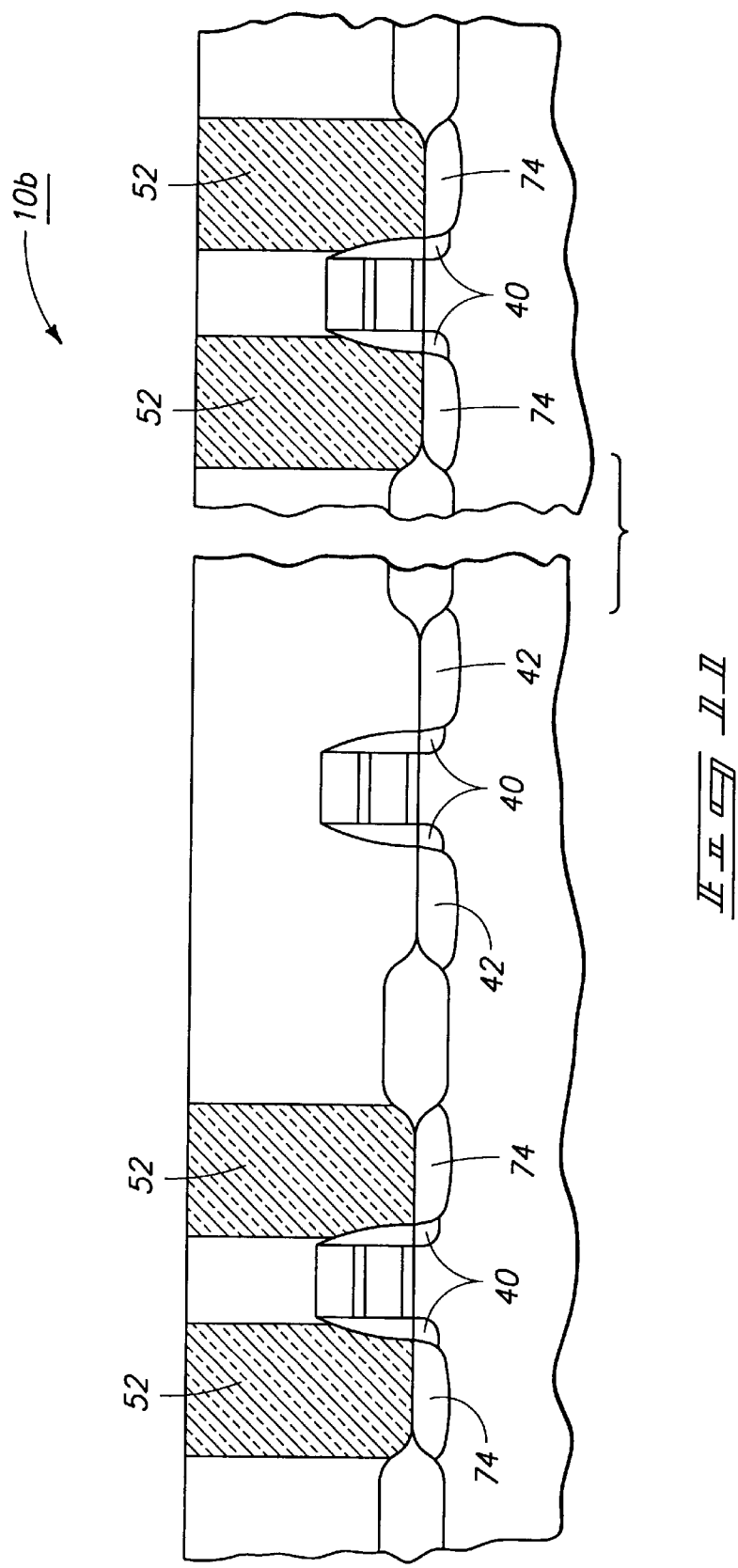
FIG. 11 is a view of the FIG. 9 wafer at a processing step subsequent to that shown by FIG. 10.

FIGS. 9–11 illustrate an alternate embodiment whereby a second blanket n-type dopant implant is provided after the first blanket implant of FIG. 1 and after the spacer formation. Like numerals from the FIGS. 1–8 embodiment are utilized where appropriate, with differences being indicated with the suffix "b". After provision of the blanket LDD implant to produce LDD regions 40, a second blanket n-type dopant implant is provided to a substrate concentration of from $1 \times 10^{19}$ ions/cm$^3$ to $5 \times 10^{20}$ ions/cm$^3$ into regions 34, 36 and 38, thus producing n-type implant regions 74. Such might be desirable to assure adequate concentration in the resultant n-type active regions 54 and 56 (FIG. 7) in the event desirable or adequate dopant out-diffusion from plugs 52 does not occur.

Referring to FIG. 10, a photoresist mask 44 is provided, followed by a subsequent p-type doping to produce p-type regions 42. Such doping is conducted at a level, such as in the previous embodiment, to assure overwhelming or overcompensating the n-type material of regions 36 with p-type material, such that the result is a PMOS construction.

Referring to FIG. 11, subsequent processing is conducted to provide polysilicon plugs 52. Subsequent anneal drives n-type dopant from plugs 52 into areas 74 to produce the composite n-type active area regions having an n-type dopant impurity concentration of at least $1 \times 10^{20}$ ions/cm$^3$.

Figure 12:
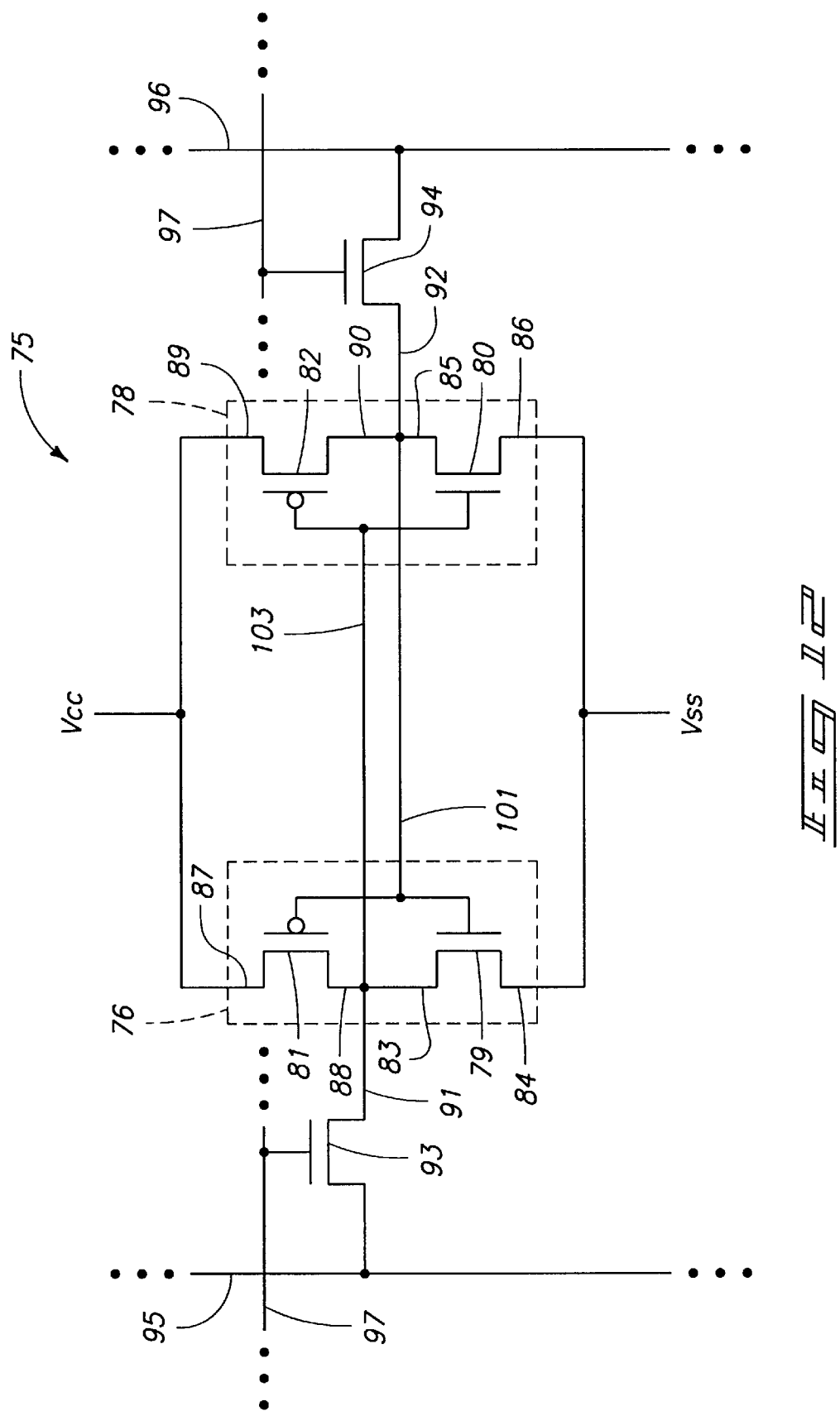
FIG. 12 is a schematic representation of a static random access memory cell processed in accordance with the invention.

The invention also has applicability to semiconductor processing methods of forming CMOS static random access memory circuitry within a semiconductor substrate. Such circuitry is illustrated in FIG. 12 and indicated generally with reference numeral 75. Such comprises first and second inverters 76 and 78 which are cross-coupled to form a bistable flip-flop.

Inverters 76 and 78 are formed by n-channel driver transistors 79 and 80 and p-channel load transistors 81 and 83. For purposes of the continuing discussion, transistors 79, 80, 81 and 82 constitute first, second, third and fourth field effect transistor gates, respectively. Driver transistor 79 has active source regions 83 and 84, while driver transistor 80 comprises substrate active regions 85 and 86. Likewise, p-type load transistor 81 comprises substrate active regions 87 and 88, with p-type load transistor 82 having active substrate regions 89 and 90. Processing is provided as shown and described above with respect to the first described embodiment to produce doping polysilicon plugs which extend outwardly or upwardly from active regions 83, 84, 85 and 86.

The conductive plugs of active regions 84 and 86 are electrically connected with one another, and are tied to a low reference or circuit supply voltage, labeled $V_{SS}$, and typically referred to as "ground." Active regions 87 and 89 of load transistors 81 and 82, respectively, are connected in series between a high reference or circuit supply voltage, labeled $V_{cc}$, and the drains of the corresponding driver transistors 79 and 80. The gates of load transistors 81 and 82 are connected to the gates of the corresponding driver transistors 79 and 80.

Specifically, the conductive plug of active region 83 of first driver transistor 79 is electrically interconnected with the gate of second driver transistor 80 via an electrical interconnect line 103, and with p-type active region 88 of load transistor 81. Likewise, the conductive plug connecting with second driver transistor 80 active region 85 electrically interconnects with the gate of first driver transistor 79 via an interconnect line 101, and with p-type active region 90 of p-type load transistor 82.

Inverter 76 has an inverter output 91 electrically connecting with or extending from active regions 83 and 88. Similarly, inverter 78 has an inverter output 92 electrically connecting with or extending outwardly from active regions 85 and 90. Lines 101 and 103 provide additional respective inverter outputs.

The inputs and outputs of inverters 76 and 78 are cross-coupled to form a flip-flop having a pair of complementary two-state outputs. Specifically, inverter output 91 is cross-coupled to inverter output 103, and inverter output 92 is cross-coupled to inverter input 101. In this configuration, inverter outputs 91 and 92 form the complementary two-state outputs of the flip-flop.

A memory flip-flop such as that just described forms one memory element of an integrated array of static memory elements. A plurality of access transistors, such as access transistors 93 and 94, are used to selectively address and access individual memory elements within the array. Access transistor 93 preferably comprises an n-channel MOSFET having one active terminal connected to cross-coupled inverter output 103. A plurality of complementary column line pairs, such as the single pair of complementary column lines 95 and 96, are connected to the remaining active terminals of access transistors 93 and 94, respectively. A row line 97 is connected to the gates of access transistors 93 and 94.

The above-described embodiments were principally directed to fabrication of random access memory integrated circuitry. The artisan will, however, appreciate that the invention has applicability to other semiconductor processing methods of forming complementary n-type doped and p-type doped active regions within a semiconductor substrate. Further, the above-described embodiments were principally directed to providing n-type dopant within a complementary process for formation of n-type active regions. However, the artisan will again appreciate that aspects of the invention may have applicability for p-type doping. Thus, concluding claims are also written to refer to first conductivity type doped and second conductivity type doped active regions as appropriate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming CMOS dynamic random access memory within a semiconductor substrate, the memory comprising an array area and an area peripheral to the array, the peripheral area comprising complementary n-type field effect transistors and p-type field effect transistors, the method comprising the following steps:

defining a memory array area and a peripheral area of a semiconductor substrate;

forming first and second transistor gates over the peripheral area, the first gate to be utilized for formation of an n-type field effect transistor, the second gate to be utilized for formation of a p-type field effect transistor;

defining first active regions adjacent the first gate and defining second active regions adjacent the second gate;

masking the first active regions while conducting p-type conductivity doping into the second active regions;

forming an insulating layer over the first and second active regions;

forming voids through the insulating layer to the first active regions;

filling the voids with n-type conductively doped polysilicon plugs, the plugs having an n-type dopant impurity concentration of at least $1\times10^{20}$ ions/cm$^3$, the first active regions having an n-type dopant concentration prior to the filling step which is in the range of from 0 ions/cm$^3$ to $1\times10^{19}$ ions/cm$^3$;

out-diffusing n-type dopant impurity from the n-type conductively doped polysilicon plugs into the substrate to increase the n-type dopant impurity concentration within the first active regions to at least $1\times10^{20}$ ions/cm$^3$; and forming a series of dynamic random access memory cells within the array, the memory cells comprising a series of n-type field effect transistors and associated capacitors.

2. The semiconductor processing method of claim 1 wherein the polysilicon plug are provided with n-type dopant impurity of less than or equal $5\times10^{20}$ ions/cm$^3$.

3. The semiconductor processing method of claim 1 further comprising providing a blanket n-type dopant implant to a substrate concentration of less than $1\times10^{19}$ ions/cm$^3$ into the first and second active regions prior to the masking step.

4. The semiconductor processing method of claim 1 further comprising providing a blanket n-type dopant implant to a substrate concentration of from $5\times10^{17}$ ions/cm$^3$ to $1\times10^{19}$ ions/cm$^3$ into the first and second active regions prior to the masking step.

5. The semiconductor processing method of claim 1 further comprising:

providing a first blanket n-type dopant LDD implant to a substrate concentration of less than $1\times10^{19}$ ions/cm$^3$ into the first and second active regions prior to the masking step;

after the first blanket implant, forming insulative spacers about sidewall edges of the first gate; and after the first blanket implant and after the spacer formation and prior to the masking step, providing a second blanket n-type dopant implant to a substrate concentration of from $1\times10^{19}$ ions/cm$^3$ to $1\times10^{20}$ ions/cm$^3$ into the first and second active regions.

6. The semiconductor processing method of claim 1 wherein the voids comprise a substantially circular cross-sectioned contact opening.

7. The semiconductor processing method of claim 1 wherein the voids comprise an elongated trough.

8. A semiconductor processing method of forming CMOS static random access memory within a semiconductor substrate, the method comprising the following steps:

forming first, second, third and fourth field effect transistor gates on a substrate, the first and second gates to be utilized for formation of cross-coupled SRAM n-type field effect driver transistors, the third and fourth gates to be utilized for formation of SRAM p-type field effect load transistors, the first and second gates defining respective opposing substrate regions for formation of desired opposing n-type substrate active regions, the third and fourth gates defining respective opposing substrate regions for formation of desired opposing p-type substrate active regions;

forming an insulating layer over the substrate over the desired n-type regions and the p-type doped regions;

forming voids through the insulating layer to the desired n-type regions;

filling the voids with n-type conductively doped polysilicon plugs, the plugs having an n-type dopant impurity concentration of at least $1\times10^{20}$ ions/cm$^3$, the desired n-type regions having an n-type dopant concentration prior to the filling step which is in the range of from 0 ions/cm$^3$ to $1\times10^{19}$ ions/cm$^3$;

out-diffusing n-type dopant impurity from the n-type conductively doped polysilicon plugs into the substrate to form the desired n-type active regions having an n-type dopant impurity concentration of at least $1\times10^{20}$ ions/cm$^3$ in the substrate;

electrically interconnecting one of the conductive plugs of the first driver transistor to one of the conductive plugs of the second driver transistor;

electrically interconnecting the other conductive plug of the first driver transistor with the second gate and with one of the p-type regions of one of the load transistors; and electrically interconnecting the other conductive plug of the second driver transistor with the first gate and with one of the p-type regions of the other load transistor.

9. The semiconductor processing method of claim 8 wherein the polysilicon plugs comprise a concentration of n-type dopant impurity of less than or equal $5\times10^{20}$ ions/cm$^3$.

10. The semiconductor processing method of claim 8 further comprising blanket implanting an n-type dopant into the substrate to a concentration of less than $1\times10^{19}$ ions/cm$^3$ into the desired n-type regions and the desired p-type regions prior to the masking step.

11. The semiconductor processing method of claim 8 further comprising blanket implanting an n-type dopant into the substrate to a concentration of from $5\times10^{17}$ ions/cm$^3$ to $1\times10^{19}$ ions/cm$^3$ into the desired n-type regions and the desired p-type regions prior to the masking step.

12. The semiconductor processing method of claim 8 further comprising:

providing a first blanket n-type dopant LDD implant to a substrate concentration of less than $1\times10^{19}$ ions/cm$^3$ into the desired n-type regions and the desired p-type regions prior to the masking step;

after the first blanket implant, forming insulative spacers about sidewall edges of the first and second gates; and after the first blanket implant and after the spacer formation and prior to the masking step, providing a second blanket n-type dopant implant to a substrate concentration of from $1\times10^{19}$ ions/cm$^3$ to $1\times10^{20}$ ions/cm$^3$ into the desired n-type regions and p-type regions.

13. A semiconductor processing method of forming complementary first conductivity type doped and second conductivity type doped active regions within a semiconductor substrate, the method comprising the following steps:

defining first and second portions of a substrate;

forming a masking layer over the first portion of the substrate;

with the masking layer over the first portion of the substrate, implanting a second conductivity type dopant into the second portion of the substrate;

removing the masking layer;

forming an insulating layer over the first and second portions of the substrate;

forming a void through the substrate to the first portion;

filling the void with a first conductivity type doped polysilicon plug; and out-diffusing first conductivity type dopant impurity from the first conductivity type doped polysilicon plug into the first portion of the substrate to form a first conductivity type active region within the first portion of the substrate.

14. The semiconductor processing method of claim 13 wherein the polysilicon plug comprises a concentration of the first conductivity type dopant of less than or equal $5\times10^{20}$ ions/cm$^3$.

15. The semiconductor processing method of claim 13 further comprising providing a blanket first conductivity type dopant implant into the first and second portions prior to the step of forming the insulating layer.

16. The semiconductor processing method of claim 13 wherein the void comprises a substantially circular cross-sectioned contact opening.

17. The semiconductor processing method of claim 13 wherein the void comprises an elongated trough.

18. A method of forming an n-type field effect transistor, p-type field effect transistor complementary to the n-type field effect transistor, and at least one memory transistor comprising the following steps:

forming a first transistor gate, a second transistor gate, and a third transistor gate over a substrate; the first, second and third transistor gates ultimately comprising transistor gates for an n-type field effect transistor, a p-type field effect transistor complementary to the n-type field effect transistor, and a memory transistor, respectively;

forming n-type LDD regions adjacent the first and third transistor gates;

forming p-type source and drain regions adjacent the second transistor gate;

forming an insulative layer over the substrate;

forming plugs extending through the insulative layer to the substrate proximate the first and third transistor gates;

forming n-type source and drain regions beneath the plugs and adjacent the first and third transistor gates; and wherein no more than two masking steps occur after forming of the first, second and third transistor gates through formation of all 1) said n-type source and drain regions, 2) said n-type LDD regions, 3) said p-type source and drain regions, and 4) said polysilicon plugs.

19. A method of forming an n-type field effect transistor, p-type field effect transistor complementary to the n-type field effect transistor, and at least one memory transistor comprising the following steps:

forming a first transistor gate, a second transistor gate, and a third transistor gate over a substrate; the first, second and third transistor gates ultimately comprising transistor gates for an n-type field effect transistor, a p-type field effect transistor complementary to the n-type field effect transistor, and a memory transistor, respectively;

forming n-type LDD regions adjacent the first and third transistor gates;

forming n-type source and drain regions adjacent the first and third transistor gates;

forming p-type source and drain regions adjacent the second transistor gate; and wherein no more than two masking steps occur after forming the first, second and third transistor gates through formation of all 1) said n-type source and drain regions, 2) said n-type LDD regions, and 3) said p-type source and drain regions.

* * * * *

UNITED STATES PATENT AND TRADEMARK OFFICE
CERTIFICATE OF CORRECTION

PATENT NO. : 5,970,335
DATED : October 19, 1999
INVENTOR(S) : Mark Helm; Charles Dennison It is certified that error appears in the above-identified patent and that said Letters Patent are hereby corrected as shown below:

Col. 8, l. 55: Replace "$5 \times 10^9 ions/cm^3$" with --$5 \times 10^{20} ions/cm^3$--

Signed and Sealed this

Third Day of April, 2001

*Attest:*

NICHOLAS P. GODICI

*Attesting Officer*   *Acting Director of the United States Patent and Trademark Office*